United States Patent
Delany et al.

(10) Patent No.: US 10,284,218 B1
(45) Date of Patent: May 7, 2019

(54) VOLTAGE WINDOW

(71) Applicant: Hewlett Packard Enterprise Development LP, Houston, TX (US)

(72) Inventors: Michael Delany, Houston, TX (US); Stewart Gavin Goodson, II, Houston, TX (US); Daniel Humphrey, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/964,410

(22) Filed: Apr. 27, 2018

(51) Int. Cl.
*H03M 1/18* (2006.01)
*H03M 1/20* (2006.01)
*H03M 1/34* (2006.01)

(52) U.S. Cl.
CPC ............. *H03M 1/20* (2013.01); *H03M 1/181* (2013.01); *H03M 1/34* (2013.01)

(58) Field of Classification Search
CPC ........... H03M 1/20; H03M 1/181; H03M 1/34
USPC .................................................. 341/155, 158
See application file for complete search history.

(56) References Cited

U.S. PATENT DOCUMENTS

| | | | |
|---|---|---|---|
| 5,296,856 A | 3/1994 | Mantong | |
| 6,191,723 B1 | 2/2001 | Lewis | |
| 6,667,705 B2 * | 12/2003 | Parfitt | G05B 19/054 341/120 |
| 7,495,589 B1 * | 2/2009 | Trifonov | H03M 1/1019 341/118 |
| 8,779,952 B1 * | 7/2014 | Zortea | H03M 1/1004 341/118 |
| 8,970,419 B2 | 3/2015 | Farley et al. | |
| 9,083,372 B2 | 7/2015 | Rud et al. | |
| 9,680,492 B1 * | 6/2017 | Farley | H03M 1/0863 |

OTHER PUBLICATIONS

Pang, W-Y. et al,, "A 10-bit 500-KS/s Low Power SAR ADC with Splitting Comparator for Bio-Medical Applications"; Nov. 16-18, 2009; 4 pages.

* cited by examiner

*Primary Examiner* — Brian K Young
(74) *Attorney, Agent, or Firm* — Brooks, Cameron & Huebsch, PLLC (57) ABSTRACT

An example apparatus includes a windowing component. The windowing component may set a first voltage level as an upper bound for a voltage window and set a second voltage level as a lower bound for the voltage window. The windowing component may modulate an input signal to have a maximum magnitude less than the upper bound for the voltage window and a minimum magnitude greater than the lower bound for the voltage window.

18 Claims, 4 Drawing Sheets

VOLTAGE WINDOW

BACKGROUND

Analog-to-digital converters (ADCs) may convert an analog signal to a digital signal. The performance of an ADC may be characterized by its bandwidth (e.g., sampling rate), signal-to-noise ratio, dynamic range, and/or resolution, among other parameters. The magnitude of signals applied to the ADC may impact the performance of the ADC.

DETAILED DESCRIPTION

Analog-to-digital converters (ADCs) may be used in electronic devices to convert analog signals to digital signals. Examples of electronic devices that may include ADCs include cellular phones, laptop computers, tablets, phablets, and smartphones, microphones, cameras, etc., as well as Internet-of-Things (IoT) enabled devices. As used herein, the term "IoT enabled devices" can, for example, refer to physical devices, vehicles, home appliances, and other devices embedded with electronics, software, sensors, actuators, and/or network connectivity which enables such devices to connect to a network and/or exchange data. Examples of IoT enabled devices include wearable technologies, smart home devices, intelligent shopping systems, and monitoring devices, among other cyber-physical systems. In addition, electronic devices may include one or more processing resources to execute instruction such as instruction corresponding to an operating system to provide common services for applications running on the computing system. Examples of operating systems include LINUX®, UNIX®, WINDOWS®, etc.

The performance of an ADC may be characterized by its bandwidth (e.g., sampling rate), signal-to-noise ratio, and/or dynamic range, which may be dependent on the resolution, linearity, accuracy, aliasing, and/or jitter of the ADC. The resolution of an ADC may correspond to the number of discrete values the ADC can produce over a range of analog values (e.g., the magnitude of an input signal received by the ADC). In examples where the resolution of the ADC is determined based on the number of discreet values the ADC can produce over a range of analog values, the resolution of the ADC may be expressed in bits.

The resolution of the ADC may also be defined electrically, for example, in terms of voltages. In examples where the resolution of the ADC is defined electrically, a minimum change in a voltage signal that yields a change in the digital output signal may be referred to as a least significant bit (LSB). In such examples, the resolution of the ADC may correspond to an overall voltage measurement range associated with the ADC divided by a number of quantization levels corresponding to a number of LSBs associated with the ADC.

In some examples, an ADC may provide an isolated measurement that converts an input analog voltage signal or current signal to a digital data value (e.g., a number) representing the magnitude of the voltage signal or current signal. The measurement may correspond to a binary data value that is proportional to the magnitude of the input voltage signal (or input current signal), however, examples are not limited to binary data values, and the measurement may correspond to other types of digital numbers or data values.

As described above, the resolution of the ADC may be affected by voltage measurement range of an ADC. Therefore, to improve the resolution of the ADC, the voltage measurement range of the ADC may be altered. This may be accomplished by scaling an input voltage (e.g., modulating a magnitude of a waveform corresponding to an input voltage signal) such that the input voltage measured by the ADC is within a threshold voltage range corresponding to a rail-to-rail voltage of the ADC.

In some approaches, scaling the input voltage to the ADC may be accomplished using one or more voltage dividers. Although the use of voltage dividers may allow for the input voltage to be scaled to a magnitude at which the input voltage measured by the ADC is within the threshold voltage range, portions of the waveform corresponding to the input signal that are not useful may still be present. In some approaches, this may result in portions of the waveform that are not relevant, for example, to feedback control being sampled by the ADC, thereby wasting resolution of the ADC.

In contrast, examples herein may include windowing an input voltage measurement using one or more windowing components, which may allow for sampling of the relevant portion or portions of the waveform. For example, utilizing the windowing component(s) described herein, a waveform corresponding to a voltage signal may be modulated such that the modulated input signal corresponds to portions of the waveform that are useful to be sampled by the ADC. In some examples, this may increase the resolution of the ADC in comparison to approaches that utilize voltage dividers to scale an input voltage, and/or may allow for greater control over the magnitude of the input signal in comparison to some approaches.

The figures herein follow a numbering convention in which the first digit corresponds to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Elements shown in the various figures herein can be added, exchanged, and/or eliminated so as to provide a number of additional examples of the disclosure. In addition, the proportion and the relative scale of the elements provided in the figures are intended to illustrate the examples of the disclosure and should not be taken in a limiting sense.

Figure 1:
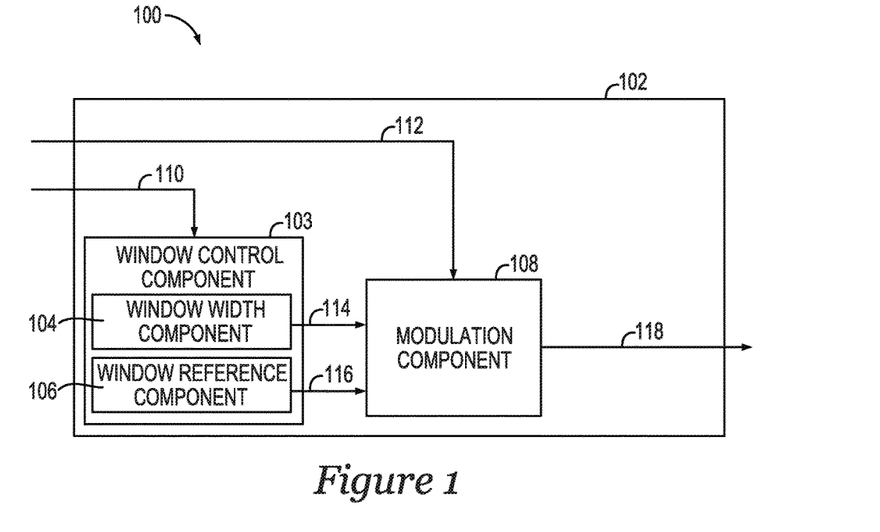
FIG. 1 illustrates an example block diagram of an apparatus for a voltage window consistent with the disclosure.

FIG. 1 illustrates an example block diagram of an apparatus 100 for a voltage window consistent with the disclosure. The apparatus 100 may include a windowing component 102, which may include a window control component 103 and a modulation component 108. The window control component 103 may include a window width component 104 and a window reference component 106. In some examples, the window control component 103 may receive a serial interface signal 110, while the modulation component 108 may receive an input signal 112. As used herein, a "component" is an electrical circuit (e.g., circuitry), hardware device (e.g., one or more processing resources and/or one or more memory resources), logic device, application-specific integrated circuit, field-programmable gate array, or combinations thereof, to perform one or more tasks or functions. As used herein, the window control component 103, window width component 104, the window reference component 106, and/or the modulation component 108 may also separately be considered an "apparatus."

The serial interface signal 110 may be a signal received from a serial interface (not explicitly shown in FIG. 1). As used herein, a "serial interface" is a communication interface that transfers data between one or more electrical devices. In some examples, the data transferred via the serial interface may include a serial interface signal 110, which may include a series of voltage pulses transferred along a communication path such as a wire. The input signal 112 may be an input voltage signal, for example, a voltage signal generated by a power source (not explicitly shown in FIG. 1).

The serial interface signal 110 may be used by the window control component 103 to set (e.g., program) a window width parameter 114 (e.g., a signal corresponding to a window width as described in more detail, herein) and/or a reference signal 116 (e.g., a reference voltage signal). For example, based on the data transferred in the serial interface signal 110, the window control component 103 may set a widow width parameter 114 and/or a reference signal 116 for use by a voltage window such as voltage window 437 illustrated in FIG. 4 and/or voltage windows 537-1, . . . , 537-N illustrated in FIG. 5. The window width parameter 114 may correspond to a voltage difference between an upper bound of a voltage window and a lower bound for the voltage window, as described in connection with FIG. 4, herein, while the reference signal 116 may correspond to a threshold voltage at which the input signal 112 is transferred out of the windowing component 102 as an output signal 118, as described in more detail, herein.

In some examples, the window width component 104 may control setting of the window width parameter 114, while the window reference component 106 may control setting of the reference signal 116. The magnitude of the reference signal 116 may be based on the magnitude of the serial interface signal 110 received by the window reference component 106. Although shown as separate components in FIG. 1, the window width component 104 and the window reference component 106 may be deployed as a single component in some examples, or as more than two discrete components in other examples. In some examples, the window width component 104 may be a digital-to-analog converter (DAC) and the window reference component 106 may be a separate DAC. Examples are not so limited, however, and the window reference component 104 and the window reference component 106 may be provided as a single DAC. In addition to, or in the alternative, the window width component 104 and/or the window reference component 106 may be provided as one or more current sourced resistors, among other suitable components and/or circuit configurations capable of generating one or more voltage levels to be transferred to the modulation component 108.

The windowing component 102 may set a first voltage level as an upper bound for a voltage window and set a lower bound for the voltage level. In some examples, the windowing component 102 may set a first voltage level as an upper bound for a voltage window and set a lower bound for the voltage level based on signals received by the modulation component 108 from the window control component 103 via one or more communication paths (e.g., wires). For example, based on a magnitude or value associated with a signal received by the modulation component 108 from the window width component 104 and a value associated with a signal received by the modulation component 108 from the window reference component 106, the modulation component 108 may set a first voltage level as an upper bound for a voltage window and set a lower bound for the voltage level.

In some examples, the windowing component 102 may set the first voltage level and/or the second voltage level based on a difference in magnitude between the input signal 112 and the reference voltage 116 generated by the window reference component 106, a difference in magnitude between the input signal 112 and the window width parameter 114 generated by the window width component 104, or combinations thereof. For example, the modulation component 108 may set the first voltage level based on a determination that the input signal 112 has a magnitude greater than the reference signal 116, and the modulation component 108 may set the second voltage level based on a determination that the input signal 112 has a magnitude less than a magnitude of the reference signal 116 plus a magnitude of the window width parameter 114.

In some examples, the windowing component 102 may set the first voltage level to a voltage level associated with the reference signal 116 based on a determination that the input signal 112 has a magnitude that is less than the magnitude of the reference signal 112. For example, the modulation component 108 may set the first voltage level to the reference signal 116 based on a determination that the input signal 112 has a magnitude that is less than the magnitude of the reference signal 112, as described in connection with FIG. 7, herein.

In some examples, the windowing component 102 may set the second voltage level to a voltage level associated with the reference signal 116 plus a voltage associated with the window width parameter 114 based on a determination that the input signal 112 has a magnitude greater than a magnitude of the reference signal 116 plus a magnitude of the window width parameter 114. For example, the modulation component 108 may set the first voltage level to a voltage level associated with the reference signal 116 plus a voltage associated with the window width parameter 114 based on a determination that the input signal 112 has a magnitude greater than a magnitude of the reference signal 116 plus a magnitude of the window width parameter 114, as described in connection with FIG. 7, herein.

Based on the received signals, the windowing component 102 may modulate the input signal 112 to have a maximum magnitude less than the upper bound for the voltage window and a minimum magnitude greater than the lower bound for the voltage window. As a result, only a portion (e.g., a particular voltage range) of the input signal 112 may be transferred from the modulation component 108. In some examples, the processed signal (e.g., processed signal 220 illustrated in FIG. 2, herein) may be transferred from the windowing component 102 to an external component (e.g., an analog-to-digital converter (ADC) such as ADC 332-1 illustrated in FIG. 3, herein) as an output signal 118. The processed signal may be alternatively referred to herein as a "modulated signal" or "modulated input signal," and the terms "processed signal," "modulated signal," and "modulated input signal" are intended to be analogous to one another.

Prior to being transferred from the windowing component 102 to the external component, the magnitude of the modulated input signal may be altered such that the resultant magnitude of the modulated input signal is greater than the magnitude of the input signal or less than the magnitude of the input signal 112 prior to being transferred to an external component. Alternatively stated, the windowing component 102 may be used to amplify or attenuate the modulated input signal, as described in more detail in connection with FIG. 2, herein.

Figure 2:
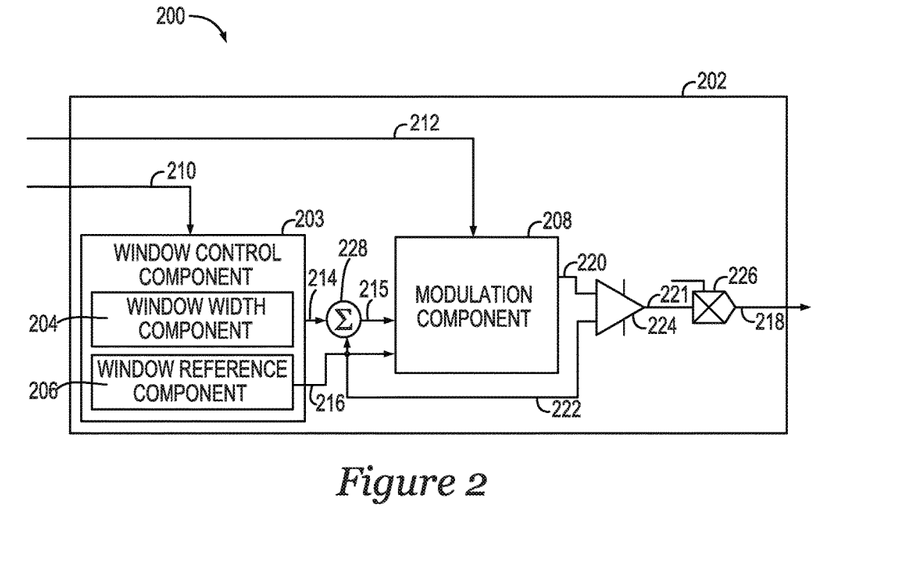
FIG. 2 illustrates another example block diagram of an apparatus for a voltage window consistent with the disclosure.

FIG. 2 illustrates another example block diagram of an apparatus 200 for a voltage window consistent with the disclosure. The example apparatus 200 illustrated in FIG. 2 may be analogous to the example apparatus 100 described in connection with FIG. 1, herein. The apparatus 200 may include windowing component 202, which includes a window control component 203, a modulation component 208, an amplifier 224, and an amplifier/attenuator 226. The amplifier 224 may be a differential amplifier such as an operation amplifier. In some examples, the amplifier 224 may use the window reference signal to alter an offset of the processed signal 220. In some examples, altering the offset of the processed signal 220 may include subtracting a low window point (e.g., a lower bound of the voltage window) to reduce a magnitude of the processed signal 220 to a ground reference potential. The amplifier/attenuator 226 may receive a signal from a digital-to-analog converter (not shown in FIG. 2), which may control an amount of gain or an amount of attenuation applied to the processed signal 220.

The window control component 203 may include a window width component 204 and a window reference component 206. In some examples, the window control component 203 may receive a serial interface signal 210, while the modulation component 208 may receive an input signal 212. As used herein, the window control component 203, window width component 204, the window reference component 206, the modulation component 208, the amplifier 224, and/or the amplifier/attenuator 226 may also separately be considered an "apparatus."

Although shown as a single signal in FIG. 2, the reference signal 216 generated by the window reference component 206 may provide multiple inputs to the modulation component 208. For example, the reference signal 216 generated by the window reference component 206 may include a "low clip" voltage signal to the modulation component 208. In some examples, the low clip voltage signal may correspond to a lower bound of the voltage window (e.g., lower bound 438 to the voltage window 437 illustrated in FIG. 4, herein). In addition, the reference signal 216 generated by the window reference component 206 may be added to the window width parameter 214 to generate an upper bound for the voltage window (e.g., upper bound 436 of the voltage window 437 illustrated in FIG. 4, herein). In some examples, the reference signal 216 generated by the window reference component 206 may include provide a common reference voltage signal for the ADC (e.g., ADCs 332-1, . . . , 332-N illustrated in FIG. 3, herein). For example, the reference signal 216 may include a signal that has had an offset removed therefrom, which may be used as a common reference voltage signal for the ADC.

The modulation component 208 may transfer the processed signal 220 to a non-inverting input of the amplifier 224 and/or the amplifier/attenuator 226. In some examples, the amplifier 224 and/or the amplifier/attenuator 226 may alter a magnitude of the processed signal 220. For example, the amplifier 224 and/or the amplifier/attenuator 226 may amplify the processed signal 220, or the amplifier 224 and/or the amplifier/attenuator 226 may attenuate the processed signal 220. Subsequent to the processed signal 220 being altered by the amplifier 224 and/or the amplifier/attenuator 226, the windowing component 202 may transfer the altered modulated signal out of the windowing component 202 as an output signal 218.

Figure 3:
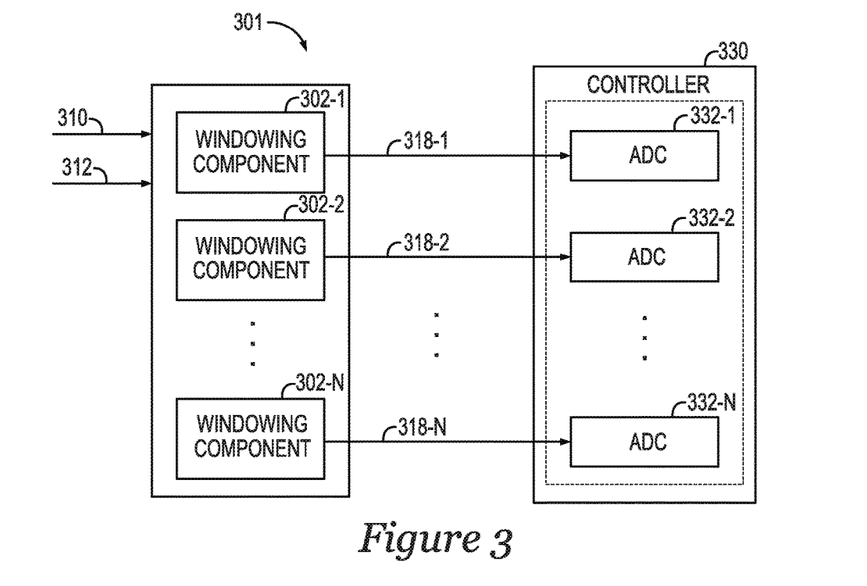
FIG. 3 illustrates an example block diagram of a system for a voltage window consistent with the disclosure.

In some examples, the amplifier 224 may alter the magnitude of the processed signal 220. In some examples, the amplifier/attenuator 226 may be used to set a gain value for the processed signal 220. The gain value set by the amplifier/attenuator 226 for the processed signal 220 may allow for the output signal 218 to be scaled such that the magnitude of the output signal 218 corresponds to an input signal magnitude (e.g., signal level) of the ADC (e.g., ADCs 332-1, . . . , 332-N) that receives the output signal 218.

In some approaches in which a voltage window is not applied to the input signal 212, each bit of an ADC (e.g., ADCs 332-1, . . . , 332-N illustrated in FIG. 3) may have a resolution of approximately 6.5 Volts/$2^n-1$ [Volts/bit], where n is the resolution of the ADC. In contrast, by applying a voltage window (e.g., voltage window 437 and/or voltage windows 537-1, . . . , 537-N illustrated in FIGS. 4 and 5, herein) to the input signal 212 the sampling range of the ADC may be on the order of 1 Volt, which may correspond to a resolution of approximately 1 Volt/$2^n-1$ [Volts/bit]. In this example, the resolution achieved by using the voltage window is approximately 6.5 times greater per bit as compared to approaches in which a voltage window is not used. Examples are not limited to these specific voltages, however, and in some examples, greater resolution or less resolution may be achieved by applying a voltage window consistent with the disclosure.

In some examples, the resolution may be further increased by altering a magnitude of the processed signal 220 using the amplifier 224 and/or the amplifier/attenuator 226. For example, by amplifying or attenuating the processed signal 220, a range of the input signal 212 may be scaled to match an input range of a controller (e.g., the controller 330 illustrated in FIG. 3) and/or the ADC(s) (e.g., ADCs 332-1, . . . , 332-N illustrated in FIG. 3), thereby increasing the effective resolution of the ADC(s). In some examples, as shown in FIG. 3, the effective resolution of the ADC(s) may be further increased by providing a plurality of windowing components to generate a plurality of voltage windows.

In some examples, an inverting input of the amplifier 224 may transfer a feedback signal 222 between a summing component 228 and the amplifier 224. The summing component 228 may include circuitry to sum one or more signals such as the feedback signal 222 and the window width parameter 214. In some examples, the summed signal 215 (e.g., the summed signal 215 that includes window width parameter 214 summed with the feedback signal 222) from the window control component 203 to the modulation component 208. In some examples, the summing component 228 may be used as part of a delta-sigma modulation operation in which analog signals are encoded into digital signals, or in which high bit-count, low-frequency digital signals are converted into lower bit-count, higher-frequency digital signals.

FIG. 3 illustrates an example block diagram of a system 301 for a voltage window consistent with the disclosure. The system 301 may include a plurality of windowing components 302-1, . . . , 302-N, which may be analogous to the windowing component 102 illustrated in FIG. 1 and/or the windowing component 202 illustrated in FIG. 2, herein. The windowing components 302-1, . . . , 302-N may receive a serial interface signal 310 and/or an input signal 312, as described in connection with FIGS. 1 and 2, herein.

As shown in FIG. 3, the system 301 may further include a controller 330, which may include a plurality of ADCs 332-1, . . . , 332-N. In some examples, the plurality of windowing components 302-1, . . . , 302-N may transfer respective output signals 318-1, . . . , 318-N to the controller 330 and/or respective ADCs 332-1, . . . , 332-N. The output signal 318-1, . . . , 318-N may correspond to the output signal 118 illustrated in FIG. 1 and/or the output signal 218 illustrated in FIG. 2.

As used herein, a "controller" (e.g., the controller 330) refers to hardware including one or more processing resources to control operation of one or more electronic devices or portions thereof. In some examples, a controller may include one or more memory resources such as ferroelectric RAM, NOR flash, programmable read-only memory (e.g., FPROM, EEPROM, OTP NVM, etc.) and/or RAM. The controller 330 may be embedded, or removable. In some examples, the controller 330 may be provided as a single integrated circuit or may be provided on a system on a chip (SoC). In some examples, the controller 330 may execute, using the one or more processing resources, instructions stored on the memory resources, or may execute instructions received by the controller externally.

In some examples, a first windowing component (e.g., windowing component 302-1) among the plurality of windowing components 302-1, . . . , 302-N may receive a set of signals (e.g., a first set of signals). The first set of signals may include an input signal 312, a first window width parameter (e.g., window width parameter 114 and/or window width parameter 214 illustrated in FIGS. 1 and 2, herein), and a first reference signal (e.g., reference signal 116 and/or reference signal 216 illustrated in FIGS. 1 and 2, herein). As discussed above in connection with FIGS. 1 and 2, the window width parameter may be generated by window width component (e.g., window width component 104 and/or window width component 204), while the reference signal may be generated by the window reference component (e.g., window reference component 106 and/or window width component 206).

The first windowing component (e.g., windowing component 302-1) may set a first voltage level as an upper bound for a first voltage window based, at least in part, on the set of signals and set a second voltage level as an upper bound for the first voltage window based, at least in part, on the set of signals. In some examples, the first windowing component (e.g., windowing component 302-1) may modulate the input signal 312 to have a maximum magnitude less than the upper bound for the first voltage window and a minimum magnitude greater than the lower bound for the first voltage window to generate a first output signal 318-1.

Figure 5:
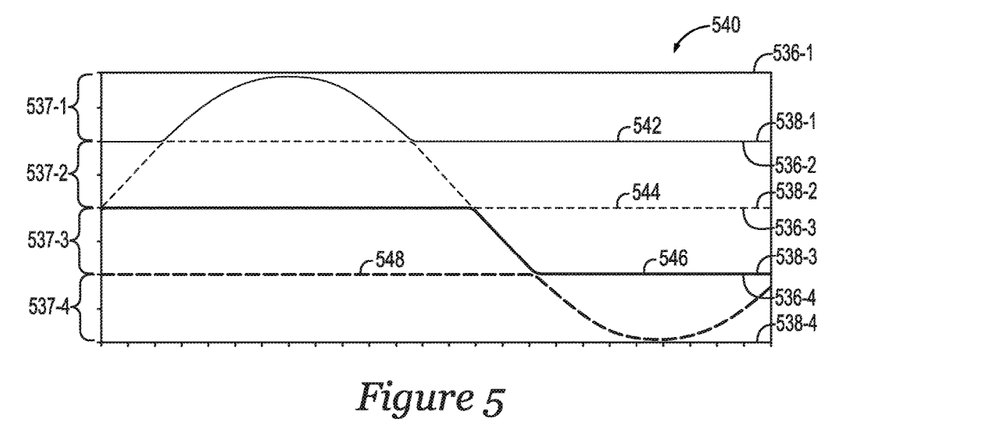
FIG. 5 illustrates an example of a plurality of voltage windows and modulated input signals consistent with the disclosure.

The upper bound for the first voltage window may correspond to the upper bound 536-1 illustrated in FIG. 5, and the lower bound for the second voltage window may correspond to the lower bound 538-1 illustrated in FIG. 5, herein. Examples are not so limited, however, and the upper bound for the second voltage window may correspond to the upper bound 536-2, the upper bound 536-3, or the upper bound 536-4 illustrated in FIG. 5, while the lower bound for the first voltage window may correspond to the lower bound 538-2, the lower bound 538-3, or the lower bound 538-4 illustrated in FIG. 5

In some examples, a second windowing component (e.g., windowing component 302-N) among the plurality of windowing components 302-1, . . . , 302-N may receive a set of signals (e.g., a second set of signals). The second set of signals may include an input signal 312, a second window width parameter (e.g., window width parameter 114 and/or window width parameter 214 illustrated in FIGS. 1 and 2, herein), and a second reference signal (e.g., reference signal 116 and/or reference signal 216 illustrated in FIGS. 1 and 2, herein).

The first set of signals and the second set of signals may, in some examples, be based on a same serial interface signal 310 and a same input signal 312. However, in some examples, the window width parameter and the reference signal corresponding to the first set of signals may be different than the window width parameter and the reference signal corresponding to the second set of signals. Stated alternatively, the first windowing component 302-1 may generate a window width parameter and a reference signal that are different than a window width parameter and a reference signal generated by the second windowing component 302-N.

The second windowing component 302-N may set a third voltage level as an upper bound for a second voltage window based, at least in part, on the second set of signals and set a fourth voltage level as an upper bound for the second voltage window based, at least in part, on the second set of signals. In some examples, the second windowing component 302-N may modulate the input signal 312 to have a maximum magnitude less than the upper bound for the second voltage window and a minimum magnitude greater than the lower bound for the second voltage window to generate a second output signal 318-N.

The upper bound for the second voltage window may correspond to the upper bound 536-2 illustrated in FIG. 5, and the lower bound for the second voltage window may correspond to the lower bound 538-2 illustrated in FIG. 5, herein. Examples are not so limited, however, and the upper bound for the second voltage window may correspond to the upper bound 536-3 or the upper bound 536-4 illustrated in FIG. 5, while the lower bound for the second voltage window may correspond to the lower bound 538-3 or the lower bound 538-4 illustrated in FIG. 5.

In some examples, the first windowing component 302-1 may set the first voltage level based, at least in part, on a determination that the input signal 312 has a magnitude greater than the reference signal and/or may set the second voltage level based, at least in part, on a determination that the input signal 312 has a magnitude less than the reference signal plus the first window width parameter, as described in more detail in connection with FIG. 7, herein.

The second windowing component 302-N may set the third voltage level based, at least in part, on a determination that the input signal 312 has a magnitude greater than the reference signal and/or set the second voltage level based, at least in part, on a determination that the input signal 312 has a magnitude less than the reference signal plus the second window width parameter.

As described in connection with FIG. 2, herein, the first windowing component 302-1 may alter a magnitude of the first output signal by attenuating the first output signal or amplifying the first output signal 318-1. Similarly, the second windowing component 302-N may alter a magnitude of the second output signal 318-N by attenuating the first output signal 318-N or amplifying the first output signal 318-N.

Subsequent to amplification or attenuation of the first output signal 318-1, the first windowing component 302-1 may transfer the first output signal 318-1 with the altered magnitude to a first analog to digital converter 332-1. Similarly, subsequent to amplification or attenuation of the second output signal 318-2, the second windowing component 302-2 may transfer the second output signal 318-N with the altered magnitude to a second analog to digital converter 332-N. In some examples, the input signal 312 may have a magnitude of around 12 Volts, while one or more of the altered output signals 318-1, . . . , 318-N may have a magnitude of less than 12 Volts. As a non-limiting example, one or more of the altered output signals 318-1, . . . , 318-N may have a magnitude of around 3.3 Volts.

Figure 4:
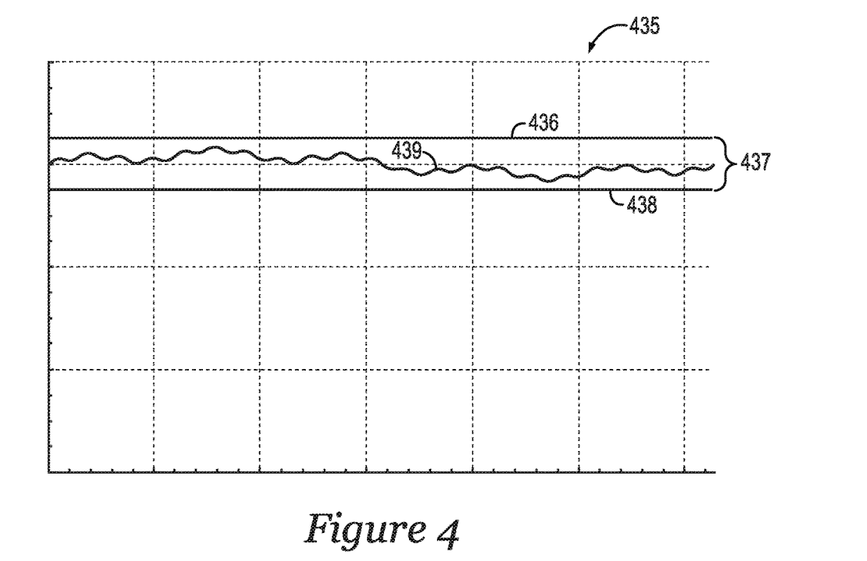
FIG. 4 illustrates an example graph of a voltage window and modulated input signal consistent with the disclosure.

FIG. 4 illustrates an example graph 435 of a voltage window and modulated input signal consistent with the disclosure. In FIG. 4, a waveform 439 is modulated such that it is within an upper bound 436 and a lower bound 438. The waveform 439 may be analogous to the processed signal 220 illustrated in FIG. 2, herein. The difference in voltage between the upper bound 436 and the lower bound 438 corresponds to a voltage window 437.

In some examples, the difference in voltage between the upper bound 436 and the lower bound 438 (e.g., the width) of the voltage window 437 may correspond to the window width parameter 114 illustrated in FIG. 1 and/or the window width parameter 214 illustrated in FIG. 2, herein. For example, the magnitude of the width of the voltage window 437 may correspond to the magnitude of a signal corresponding to the window width parameter.

The difference in voltage between the upper bound 436 and the lower bound 438 (e.g., the width) of the voltage window 437 may be set by the window width component (e.g., window width component 104 illustrated in FIG. 1 and/or the window width component 204 illustrated in FIG. 2, herein). For example, the width of the voltage window 437 may be set by the window width component based on the data corresponding to a serial interface signal (e.g., serial interface signal(s) 110, 210, and/or 310 illustrated in FIGS. 1-3, herein).

FIG. 5 illustrates an example of a plurality of voltage windows and modulated input signals 542, 544, 546, 548 consistent with the disclosure. In the example illustrated in FIG. 5, a portion of a sine wave may have a plurality of voltage windows 537-1, . . . , 537-N assigned (e.g., set by the windowing components 102, 202, and/or 302 illustrated in FIGS. 1-3) thereto. The sine wave illustrated in FIG. 5 may correspond to one or more portions of the waveform 439 illustrated in FIG. 4, herein, and/or the sine wave may correspond to the input signal 112, 212, and/or 312 illustrated in FIGS. 1-3, herein. Although FIG. 5 illustrates a sinusoidally varying waveform, examples are not so limited, and the waveform may be a square waveform, a triangle waveform, a sawtooth waveform, and/or combinations thereof.

The voltage windows 537-1, . . . , 537-4 may correspond to the voltage window 437 illustrated in FIG. 4, herein. In some examples, the voltage window 537-1 may correspond to a voltage window generated by the windowing component 302-1 illustrated in FIG. 3; the voltage window 537-2 may correspond to a voltage window generated by the windowing component 302-2 illustrated in FIG. 3; and the voltage window 537-4 may correspond to a voltage window generated by the windowing component 302-N illustrated in FIG. 3. Although FIG. 5 illustrates four discrete voltage windows 537-1, . . . , 537-4, examples are not so limited, and less than four voltages windows 537-1, . . . , 537-4 (e.g., one, two, or three voltage windows), or more than four voltage windows 537-1, . . . , 537-4 (e.g., five, six, seven, M voltage windows, where M is an integer) may be generated by the windowing components 302-1, . . . , 302-N illustrated in FIG. 3, herein.

In some examples, each voltage window 537-1, . . . , 537-N may have a respective upper bound 536-1, . . . , 536-N and a respective lower bound 538-1, . . . , 538-N corresponding thereto. For example, the top edge of the brace corresponding to voltage window 537-1 and the lower edge of the brace corresponding to voltage window 537-1 may represent an upper bound 536-1 of the voltage window 537-1 and the lower bound 538-1 of the voltage window 537-1, respectively. Similarly, the top edge of the brace corresponding to voltage window 537-2 and the lower edge of the brace corresponding to voltage window 537-2 may represent an upper bound 536-2 of the voltage window 537-2 and the lower bound 538-2 of the voltage window 537-2, respectively. The top edge of the brace corresponding to voltage window 537-3 and the lower edge of the brace corresponding to voltage window 537-3 may represent an upper bound 536-3 of the voltage window 537-3 and the lower bound 538-3 of the voltage window 537-3, respectively, and the top edge of the brace corresponding to voltage window 537-4 and the lower edge of the brace corresponding to voltage window 537-4 may represent an upper bound 536-4 of the voltage window 537-4 and the lower bound 538-4 of the voltage window 537-4, respectively.

As shown in FIG. 5, portions of the example sine wave that fall within respective voltage windows of the plurality of voltage windows 537-1, . . . , 537-4 may be modulated such that a magnitude of a portion of the signal falls within each voltage window 537-1, . . . , 537-4. For example, the thin solid line corresponding to curve 542 may represent a modulated output signal (e.g., modulated output signal 118, 218, and/or one of the modulated output signals 318-1, . . . , 318-N illustrated in FIGS. 1-3). Similarly, the thin dashed line corresponding to curve 544, the thick solid line corresponding to curve 546, and/or the thick dashed line corresponding to curve 548 may represent one or more of the modulated output signals described above in connection with FIGS. 1-4.

In some examples, as described in connection with FIGS. 1-3, herein, the windowing component (e.g., windowing component 102, windowing component 202, and/or windowing components 302-1, . . . , 302-N) may modulate the waveform by setting the voltage windows 537-1, . . . , 537-4 to generate the modulated input signals 542, 544, 546, and/or 548 shown in FIG. 5.

Figure 6:
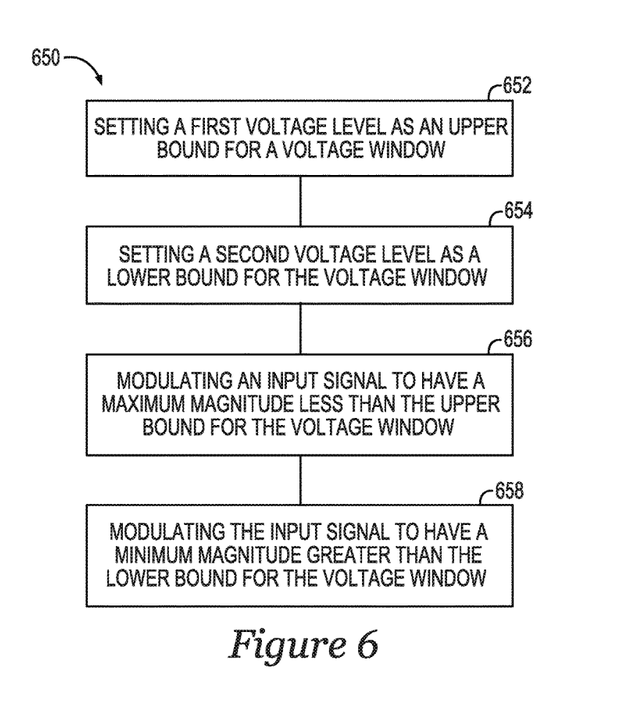
FIG. 6 illustrates an example flow diagram of a method for a voltage window consistent with the disclosure.

FIG. 6 illustrates an example flow diagram of a method 650 for a voltage window consistent with the disclosure. At block 652, the method 650 may include setting a first voltage level as an upper bound for a voltage window. The first voltage level may correspond to the upper bound 436 for the voltage window 437 illustrated in FIG. 4, herein. As discussed in connection with FIGS. 1 and 2, the first voltage level corresponding to the upper bound for the voltage window may be set by the window width component (e.g., window width component 104 and/or window width component 204 illustrated in FIGS. 1 and 2).

At block 654, the method 560 may include setting a second voltage level as a lower bound for a voltage window. The second voltage level may correspond to the lower bound 438 for the voltage window 437 illustrated in FIG. 4, herein. As discussed in connection with FIGS. 1 and 2, the second voltage level corresponding to the lower bound for the voltage window may be set by the window width component (e.g., window width component 104 and/or window width component 204 illustrated in FIGS. 1 and 2).

At block 656, the method 650 may include modulating an input signal to have a maximum magnitude less than the upper bound for the voltage window. The input signal may correspond to input signal 112, input signal 212, and/or input signal 312 illustrated and discussed in connection with FIGS. 1-3, herein. In some examples, the input signal may be modulated by a modulation component such as modulation component 108 and/or modulation component 208 illustrated and discussed in connection with FIGS. 1 and 2, herein.

At block 658, the method 650 may include modulating the input signal to have a minimum magnitude greater than the lower bound for the voltage window. The input signal may correspond to input signal 112, input signal 212, and/or input signal 312 illustrated and discussed in connection with FIGS. 1-3, herein. In some examples, the input signal may be modulated by a modulation component such as modulation component 108 and/or modulation component 208 illustrated and discussed in connection with FIGS. 1 and 2, herein.

In some examples, the method 650 may include setting the first voltage level based on a determination that the input signal has a magnitude greater than a reference signal. The reference signal may correspond to reference signal 116 and/or reference signal 216 illustrated and discussed in connection with FIGS. 1 and 2, herein. The method 650 may further include setting the second voltage level based on a determination that the input signal has a magnitude less than the reference signal plus a window width parameter. The window width parameter (e.g., window width parameter 114, 214, and/or 314 illustrated in FIGS. 1-3, herein) may correspond to the width of the voltage window 437 illustrated and discussed in connection with FIG. 4. As used herein, the term "plus" refers to an addition of operation performed on one or more signals. For example, the reference signal plus the window width parameter may refer to a magnitude of a signal that results from the addition of the magnitude of the reference signal and the window width parameter, as discussed in more detail in connection with FIG. 7, herein.

The method 650 may further include setting the first voltage to a voltage level associated with a reference signal based on a determination that input signal has a magnitude less than the reference signal. For example, the first voltage may be set to a voltage corresponding to the reference signal if the input signal has a magnitude that is less than a magnitude of the reference signal, as discussed in more detail in connection with FIG. 7, herein. In some examples, a windowing component (e.g., windowing component 102, 202, and/or 302 illustrated in FIGS. 1-3, herein) may set the first voltage to a voltage level associated with the reference signal based on the determination that input signal has a magnitude less than the reference signal.

In some examples, the method 650 may include setting the second voltage level to a voltage level associated with a reference signal plus a window width parameter based on a determination that the input signal has magnitude greater than the reference signal plus a window width parameter. For example, the second voltage may be set to a voltage corresponding to the reference signal plus a magnitude corresponding to the window width parameter if the input signal has a magnitude that is less than a magnitude of the reference signal plus the magnitude corresponding to the window width parameter, as discussed in more detail in connection with FIG. 7, herein. In some examples, a windowing component (e.g., windowing component 102, 202, and/or 302 illustrated in FIGS. 1-3, herein) may set the second voltage level to the voltage level associated with the reference signal plus the window width parameter based on the determination that the input signal has magnitude greater than the reference signal plus a window width parameter.

In some examples, the method may include altering a magnitude of the input signal subsequent to modulating the input signal. For example, the method may include amplifying the input signal subsequent to modulating the input signal or attenuating input signal subsequent to modulating the input signal. The method may further include transferring the modulated input signal to an ADC (e.g., ADC 332-1, . . . , 332-N illustrated in FIG. 3, herein).

Figure 7:
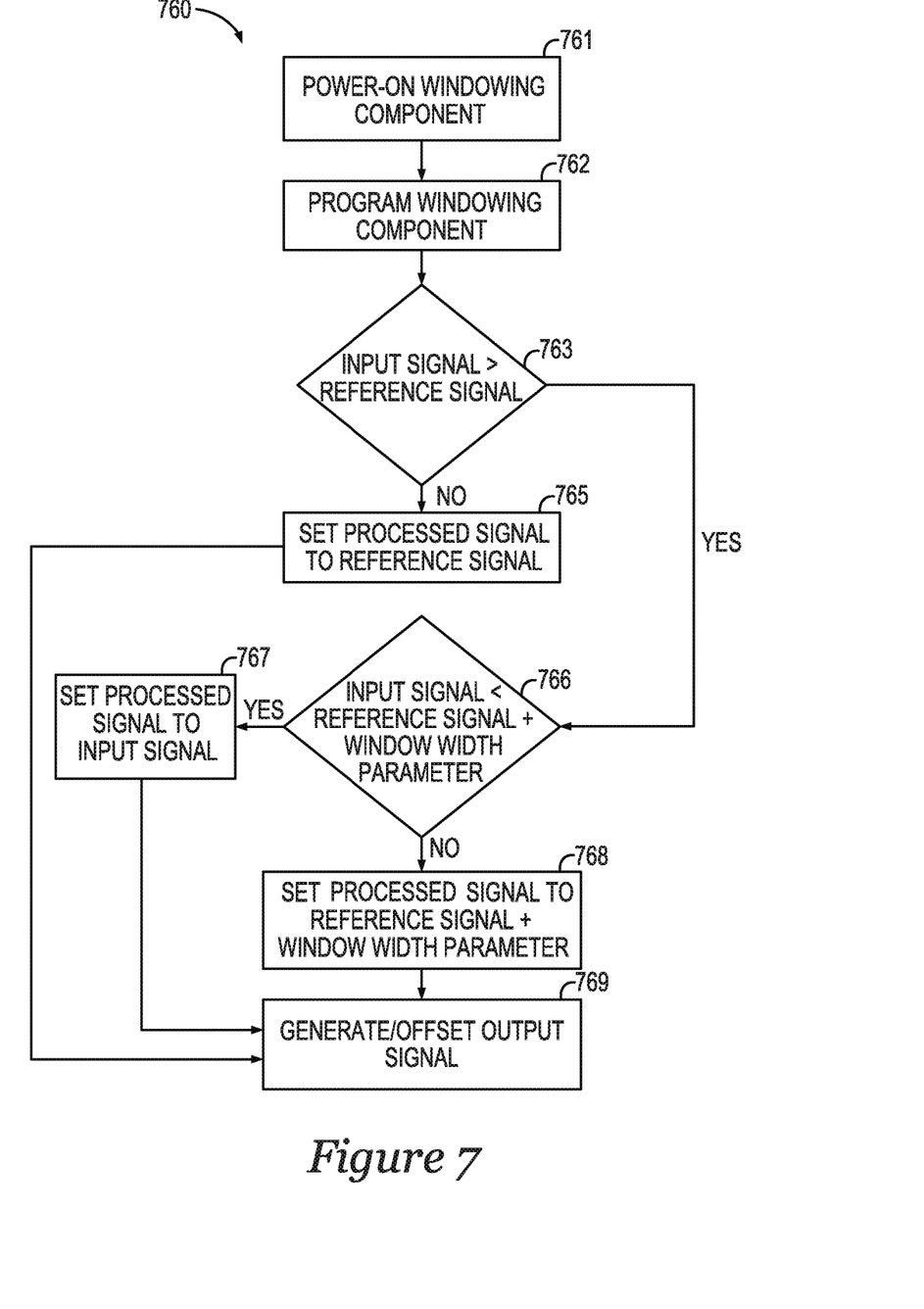
FIG. 7 illustrates an example flow chart for a voltage window consistent with the disclosure.

FIG. 7 illustrates an example flow chart 760 for a voltage window consistent with the disclosure. At block 761, a windowing component (e.g., windowing component 102, windowing component 202, and/or windowing components 302-1, . . . , 302-N illustrated in FIGS. 1-3, herein) may be powered on. In some examples, powering the windowing component on may include providing a power signal to the windowing component.

Once the windowing component is powered on, the windowing component may be programmed, as shown at block 762. Programming the windowing component may include receiving a serial interface signal (e.g., serial interface signal 110, serial interface signal 210, and/or serial interface signal 310 illustrated in FIGS. 1-3, herein), generating a window width parameter (e.g., window width parameter 114 and/or window width parameter 214 illustrated in FIGS. 1 and 2), generating a reference signal (e.g., reference signal 116 and/or reference signal 216 illustrated in FIGS. 1 and 2), and/or receiving an input signal (e.g., input signal 112, input signal 212, and/or input signal 312 illustrated in FIGS. 1-3, herein).

At block 763, the windowing component may determine if the input signal has a magnitude greater than the reference signal. For example, at block 763, the windowing component may determine if a voltage level associated with the input signal is greater than a voltage level associated with the reference signal. In some examples, if the magnitude of the input signal is greater than the magnitude of the reference signal, the windowing component may set the output signal (e.g., output signal 118, output signal 218, and/or output signals 318-1, . . . , 318-N illustrated in FIGS. 1-3, herein) to a voltage level associated with the input signal.

If the windowing component determines that the input signal does not have a magnitude greater than the reference signal (e.g., if the magnitude of the reference signal is greater than the magnitude of the input signal), at block 765 the windowing component may set the magnitude of a processed signal (e.g., processed signal 221 illustrated in FIG. 2, herein) to the magnitude of the reference signal (e.g., a reference voltage signal).

At block 766, the windowing component may determine if the input signal has a magnitude less than a magnitude of the reference signal plus a magnitude of a window width parameter (e.g., window width parameter 114 and/or window width parameter 214 illustrated in FIGS. 1 and 2, herein). If the input signal has a magnitude less than a magnitude of the reference signal plus a magnitude of a window width parameter, the windowing component may set the magnitude of the output signal to the magnitude of the input signal at block 767.

If the windowing component determines that the input signal does not have a magnitude less than the reference signal plus the window width parameter (e.g., if the magnitude of the reference signal is less than the magnitude of the input signal plus the magnitude of the window width parameter), at block 768 the windowing component may set the magnitude of the processed signal to the magnitude of the reference signal plus the magnitude of the window width parameter as described in connection with FIGS. 1 and 6, herein.

In some examples, at block 769, the windowing component may generate and/or offset an output signal (e.g., output signal 218 illustrated in FIG. 2, herein). In some examples, the output signal may be offset to a reference voltage corresponding to an ADC (e.g., ADCs 332-1, . . . , 332-N illustrated in FIG. 3, herein) that will receive the output signal. For example, the difference in magnitude between an interval measurement and the reference voltage. For example, at block 769, the windowing component may set the magnitude of the output signal to the magnitude of the interval measurement minus the reference signal voltage.

Setting the output signal to the difference in magnitude between the interval measurement and the reference voltage may correspond to changing a voltage offset to provide a common reference voltage (e.g., a ground reference potential) to the ADC. A magnitude of the output signal corresponding to the difference in magnitude between the interval measurement and the reference signal voltage may, in some examples, be altered prior to being transferred to the ADC. For example, the magnitude of the output signal corresponding to the difference in magnitude between the interval measurement and the reference signal voltage may be amplified or attenuated prior to being transferred to the ADC.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. As used herein, designators such as "N", etc., particularly with respect to reference numerals in the drawings, indicate that a number of the particular feature so designated can be included. A "plurality of" is intended to refer to more than one of such things.

What is claimed:

1. An apparatus, comprising:
  a window reference component to set a reference voltage based on a magnitude of a received serial interface signal; and
  a windowing component to:
    receive the reference voltage;
    set a first voltage level as an upper bound for a voltage window based on the reference voltage;
    set a second voltage level as a lower bound for the voltage window based on the reference voltage; and
    modulate an input signal to have a maximum magnitude less than the upper bound for the voltage window and a minimum magnitude greater than the lower bound for the voltage window.

2. The apparatus of claim 1, wherein the windowing component is to set a voltage difference between the upper bound of the voltage window and the lower bound of the voltage window based, at least in part, on a value associated with a window width parameter received from a window width component.

3. The apparatus of claim 1, wherein the windowing component is to:
  alter a magnitude of the modulated input signal; and
  transfer the modulated signal with the altered magnitude to an analog to digital converter.

4. The apparatus of claim 1, wherein the windowing component is to alter the magnitude of the modulated input signal by amplifying the modulated input signal or attenuating the modulated input signal.

5. The apparatus of claim 1, wherein the windowing component is to:
  set the modulated input signal to the second voltage level when the input signal has a magnitude less than a reference signal; and
  set the modulated input signal to the first voltage level when the input signal has a magnitude greater than the reference signal plus a window width parameter.

6. The apparatus of claim 1, wherein the windowing component is to set the second voltage level to a voltage level associated with the reference voltage.

7. The apparatus of claim 1, wherein the windowing component is to set the first voltage level to a voltage level associated with the reference voltage plus a window width parameter.

8. A system, comprising:
  a first windowing component to:
    receive a first set of signals;
    set a first voltage level as an upper bound for a first voltage window based, at least in part, on the first set of signals;
    set a second voltage level as an upper bound for the first voltage window based, at least in part, on the first set of signals; and
    modulate the input signal to have a maximum magnitude less than the upper bound for the first voltage window and a minimum magnitude greater than the lower bound for the first voltage window to generate a first output signal; and
  a second windowing component to:
    receive a second set of signals;
    set a third voltage level as an upper bound for a second voltage window based, at least in part, on the second set of signals;
    set a fourth voltage level as an upper bound for the second voltage window based, at least in part, on the second set of signals; and
    modulate the input signal to have a maximum magnitude less than the upper bound for the second voltage window and a minimum magnitude greater than the lower bound for the second voltage window to generate a second output signal.

9. The system of claim 8, wherein the first set of signals includes an input signal, a first window width parameter, and a reference signal, and wherein the second set of signals includes the input signal, a second window width parameter, and the reference signal.

10. The system of claim 9, wherein the first windowing component is to:
  set the first voltage level based, at least in part, on a determination that the input signal has a magnitude greater than the reference signal; and
  set the second voltage level based, at least in part, on a determination that the input signal has a magnitude less than the reference signal plus the first window width parameter, and wherein the second windowing component is to:
    set the third voltage level based, at least in part, on a determination that the input signal has a magnitude greater than the reference signal; and set the second voltage level based, at least in part, on a determination that the input signal has a magnitude less than the reference signal plus the second window width parameter.

11. The system of claim 8, wherein the first windowing component is to:
    alter a magnitude of the first output signal by attenuating the first output signal or amplifying the first output signal; and
    transfer the first output signal with the altered magnitude to a first analog to digital converter.

12. The system of claim 8, wherein the second windowing component is to:
    alter a magnitude of the second output signal by attenuating the first output signal or amplifying the first output signal; and
    transfer the second output signal with the altered magnitude to a second analog to digital converter.

13. The system of claim 8, wherein the input signal has a magnitude around 12 Volts or greater and the first output signal and the second output signal each have a magnitude of less than 12 Volts.

14. A method, comprising:
    setting a first voltage level as an upper bound for a voltage window;
    setting a second voltage level as a lower bound for the voltage window;
    generating a modulated signal by modulating an input signal such that the modulated signal:
        is equal to the second voltage when the input signal is less than a reference signal;
        is equal to the first voltage when the input signal is greater than the reference signal plus a window width parameter; and
        corresponds to the input signal otherwise.

15. The method of claim 14, further comprising setting the second voltage level to a voltage level associated with the reference signal.

16. The method of claim 14, further comprising setting the first voltage level to a voltage level associated with the reference signal plus the window width parameter.

17. The method of claim 14, further comprising altering a magnitude of the modulated signal subsequent to modulating the input signal.

18. The method of claim 14, further comprising transferring the modulated signal to an analog to digital converter.

* * * * *